(12) United States Patent
Cheung et al.

(10) Patent No.: US 8,624,857 B2
(45) Date of Patent: Jan. 7, 2014

(54) HAPTICS EFFECT CONTROLLER ARCHITECTURE AND INSTRUCTION SET

(75) Inventors: Hugo Cheung, Tucson, AZ (US); Anand Gupta, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 353 days.

(21) Appl. No.: 13/024,042

(22) Filed: Feb. 9, 2011

(65) Prior Publication Data

US 2012/0200509 A1 Aug. 9, 2012

(51) Int. Cl.
 *G06F 3/041* (2006.01)
(52) U.S. Cl.
 USPC ............................ 345/173; 345/156; 345/174
(58) Field of Classification Search
 USPC .................................................. 345/156, 173
 See application file for complete search history.

(56) References Cited

U.S. PATENT DOCUMENTS

| 7,791,588 | B2 | 9/2010 | Tierling et al. | |
|---|---|---|---|---|
| 2004/0236450 | A1* | 11/2004 | Bryant et al. | 700/108 |
| 2005/0085299 | A1* | 4/2005 | Murzanski et al. | 463/38 |
| 2005/0134561 | A1* | 6/2005 | Tierling et al. | 345/156 |
| 2006/0049920 | A1* | 3/2006 | Sadler et al. | 340/407.1 |
| 2006/0119573 | A1* | 6/2006 | Grant et al. | 345/156 |
| 2006/0129719 | A1* | 6/2006 | Cruz-Hernandez et al. | 710/58 |
| 2006/0290662 | A1* | 12/2006 | Houston et al. | 345/156 |
| 2007/0057916 | A1 | 3/2007 | Tierling | |
| 2008/0198139 | A1* | 8/2008 | Lacroix et al. | 345/173 |
| 2009/0189873 | A1* | 7/2009 | Peterson et al. | 345/173 |
| 2009/0210568 | A1* | 8/2009 | Peterson et al. | 710/15 |
| 2009/0284485 | A1* | 11/2009 | Colgate et al. | 345/173 |
| 2010/0156818 | A1* | 6/2010 | Burrough et al. | 345/173 |
| 2010/0188327 | A1* | 7/2010 | Frid et al. | 345/156 |
| 2010/0328230 | A1* | 12/2010 | Faubert et al. | 345/173 |
| 2011/0080367 | A1* | 4/2011 | Marchand et al. | 345/174 |

OTHER PUBLICATIONS

PCT Search Report mailed Sep. 3, 2012.

* cited by examiner

*Primary Examiner* — Amare Mengistu
*Assistant Examiner* — Sarvesh J Nadkarni
(74) *Attorney, Agent, or Firm* — Alan A. R. Cooper; W. James Brady, III; Frederick J. Telecky, Jr.

(57) ABSTRACT

A method for generating a desired haptics effect is provided. A haptics effect instruction is generated by a host processor responsive to a touch screen, where the haptics effect instruction corresponds to the desired haptics effect. This haptics effect instruction is received by a haptics driver, and a haptic profile from the haptics effect instruction is generated from the haptics effect instruction. The haptic profile includes at least one of a profile word, a move word, wait/halt word, and a branch word, and a sine wave is generated from the from the haptic profile that corresponds to the desired haptics effect.

22 Claims, 6 Drawing Sheets

PROFILE WORD 400

FIG. 4

| OPCODE | DATA | |
|---|---|---|
| 11 | AMPLITUDE AND FREQUENCY | PROFILE DURATION |
| 402 | 404 | 406 |

MOVE WORD 500

FIG. 5

| OPCODE | DATA | | |
|---|---|---|---|
| 10 | RESERVED | REGISTER NUMBER | REGISTER VALUE |
| 502 | 504 | 506 | 508 |

WAIT/HALT WORD 600

FIG. 6

| OPCODE | DATA | |
|---|---|---|
| 00 | BREAK/NO BREAK | WAIT DURATION OR HALT |
| 602 | 604 | 606 |

BRANCH WORD 700

FIG. 7

| OPCODE | DATA | | |
|---|---|---|---|
| 10 | RESERVED | REGISTER NUMBER | JUMP LOCATION |
| 702 | 704 | 706 | 708 |

HAPTICS EFFECT CONTROLLER ARCHITECTURE AND INSTRUCTION SET

TECHNICAL FIELD

The invention relates generally to haptics effects and, more particularly, to a haptics controller and its associated instruction set.

BACKGROUND

Touch screens are becoming increasingly common, but touch screens do not inherently have a feedback mechanism (like audible click from a conventional keyboard). Thus, haptic or mechanic vibration feedback has emerged as a new technology that can provide a feedback mechanism that would not otherwise be present. Conventional haptic solutions, however, suffer from demanding control from host controller or processor. Namely, conventional haptics solutions are generally limited host interface communication bottle neck, which can limit haptic effect variations (i.e., variable frequency control and gain control). Moreover, many of these haptics solutions have low power efficiency, which is due at least in part to an on-chip low drop-out regulator (LDO). Therefore, there is a need for a method and/or apparatus that addresses shortcomings in conventional haptics solutions.

An example of a conventional haptics solution is U.S. Pat. No. 7,791,588.

SUMMARY

A preferred embodiment of the present invention, accordingly, provides an apparatus. The apparatus comprises a plurality of haptics instructions; a controller; an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction; and a sine wave generator that is coupled to the controller so as to receive the haptic profile and that generates a sine wave from the haptic profile that corresponds to the desired haptics effect.

In accordance with a preferred embodiment of the present invention, the plurality of instruction further comprises a profile instruction, a move instruction, a wait/halt instruction, and a branch instruction, and wherein a haptic profile further comprises at least one of a profile word, a move word, a wait/halt word, and a branch word that each include opcode and data, and wherein the profile instruction, the move instruction, the wait/halt instruction, and the branch instruction further comprise the opcode for the profile word, the move word, the wait/halt word, and the branch word, respectively.

In accordance with a preferred embodiment of the present invention, the data for the profile word further comprises amplitude, frequency, and profile duration.

In accordance with a preferred embodiment of the present invention, the data for the move word further comprises a register number and register values.

In accordance with a preferred embodiment of the present invention, the data for the wait/halt word further comprises at least one of a wait duration and halt.

In accordance with a preferred embodiment of the present invention, the data for the branch word further comprises a register number and a jump location.

In accordance with a preferred embodiment of the present invention, the apparatus further comprises an amplifier that is coupled to the sine wave generator.

In accordance with a preferred embodiment of the present invention, the amplifier further comprises a class-D amplifier.

In accordance with a preferred embodiment of the present invention, an apparatus is provided. The apparatus comprises an host interface; a touch screen interface that is configured to receive data from a touch screen; an analog-to-digital converter (ADC) that is coupled to the touch screen interface; processing circuitry that is coupled to the ADC and the host interface; a haptics driver that is coupled to the host interface, wherein the haptics driver is configured to receive a haptics effect instruction that corresponds to a desired haptics effect, wherein the haptics driver includes: a plurality of haptics instructions; a controller; an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction; a sine wave generator that is coupled to the controller so as to receive the haptic profile and that generates a sine wave from the haptic profile that corresponds to the desired haptics effect; an amplifier that is coupled to the sine wave generator.

In accordance with a preferred embodiment of the present invention, the instruction sequencer further comprises: a program counter circuitry that is configured to generate an address sequence corresponding to the haptic profile; an instruction memory that stores the haptic profile and that is coupled to the program counter circuitry, wherein the instruction memory is configured to receive addresses from the program counter according to the address sequence; and an instruction register that is coupled to the instruction memory.

In accordance with a preferred embodiment of the present invention, the sine wave generator further comprises: a sine angle calculator that is coupled to the controller; a lookup table (LUT) that is coupled to the sine angle calculator and the controller; and an amplitude multiplier that is coupled to the LUT and controller.

In accordance with a preferred embodiment of the present invention, an apparatus is provided. The apparatus comprises a touch screen; a host processor that is configured to generate a haptics effect instruction that corresponds to a desired haptics effect; a controller having: an host interface that is coupled to the host processor; a touch screen interface that is coupled to the touch screen; an ADC that is coupled to the touch screen interface; processing circuitry that is coupled to the ADC and the host interface; a haptics driver that is coupled to the host interface, wherein the haptics driver is configured to receive a haptics effect instruction that corresponds to a desired haptics effect, wherein the haptics driver includes: a plurality of haptics instructions; a controller; an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction; a sine wave generator that is coupled to the controller so as to receive the haptic profile and that generates a sine wave from the haptic profile that corresponds to the desired haptics effect; and an amplifier that is coupled to the sine wave generator that generates a sine wave that corresponds to the desired haptics effect; and an actuator that is coupled to the amplifier.

In accordance with a preferred embodiment of the present invention, the plurality of instruction further comprises a profile instruction, a move instruction, a wait/halt instruction, and a branch instruction, and wherein a haptic profile further comprises at least one of: a profile word having the profile instruction as its opcode and having amplitude, frequency, and profile duration as its data; a move word having the move instruction as its opcode, and having a register number and register values as its data; a wait/halt word having the wait/halt instruction as its opcode and having at least one of a wait duration and halt as its data; and a branch word having the branch instruction as its opcode and having a register number and a jump location as its data.

In accordance with a preferred embodiment of the present invention, the sine wave generator further comprises: a sine angle calculator that is coupled to the controller; a lookup table (LUT) that is coupled to the sine angle calculator and the controller; and an amplitude multiplier that is coupled to the LUT and controller.

In accordance with a preferred embodiment of the present invention, a method for generating a desired haptics effect is provided. The method comprises generating a haptics effect instruction by a host processor responsive to a touch screen, wherein the haptics effect instruction corresponds to the desired haptics effect; receiving the haptics effect instruction by a haptics driver; generating a haptic profile from the haptics effect instruction, wherein the haptic profile includes at least one of a profile word, a move word, wait/halt word, and a branch word; and generating a sine wave from the from the haptic profile that corresponds to the desired haptics effect.

In accordance with a preferred embodiment of the present invention, the step of generating the haptic profile further comprises: decoding the haptics effect instruction; and calling the haptics profile from instruction memory.

In accordance with a preferred embodiment of the present invention, the step of generating the haptics effect instruction further comprises: receiving an analog data set from the touch screen; converting the analog data set to a digital data set; and determining the haptics effect instruction from the digital data set.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 1:
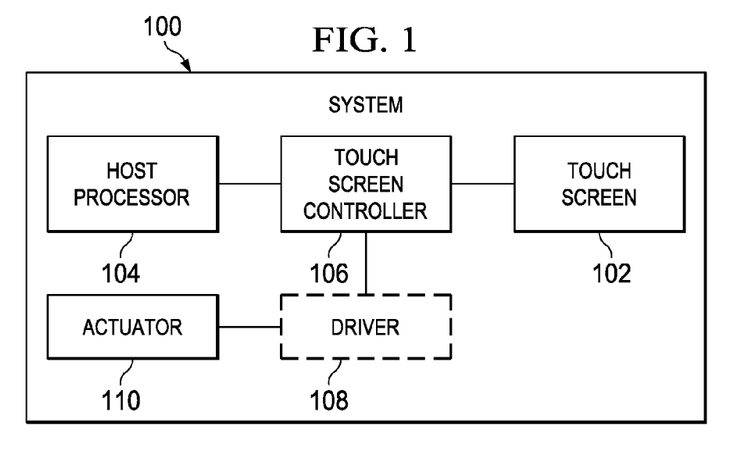
FIG. 1 is an example of a system in accordance with a preferred embodiment of the present invention.

Turning to FIG. 1, an example of a system 100 in accordance with a preferred embodiment of the present invention can be seen. This system 100 can be a number of devices such as portable media players, smartphones, or gaming controllers and generally comprises a touch screen 102 (which can be a capacitive or resistive touch screen), a host processor 104 (i.e., digital signals processor or DSP), touch screen controller 106, a driver 108 (which can be an amplifier), and an actuator 110 (which can be a linear actuator, a piezoelectric transducer, a motor, and so forth). Generally, an user can interact with the system 100 through the touch screen 102 (which is controlled by the touch screen controller 106 and host processor 104). Based on the user's interaction with the system 100, haptic effects can be generated. Generally, the touch screen controller 106 provides a sine wave to the actuator 110 (either directly or through driver 108).

Figure 2:
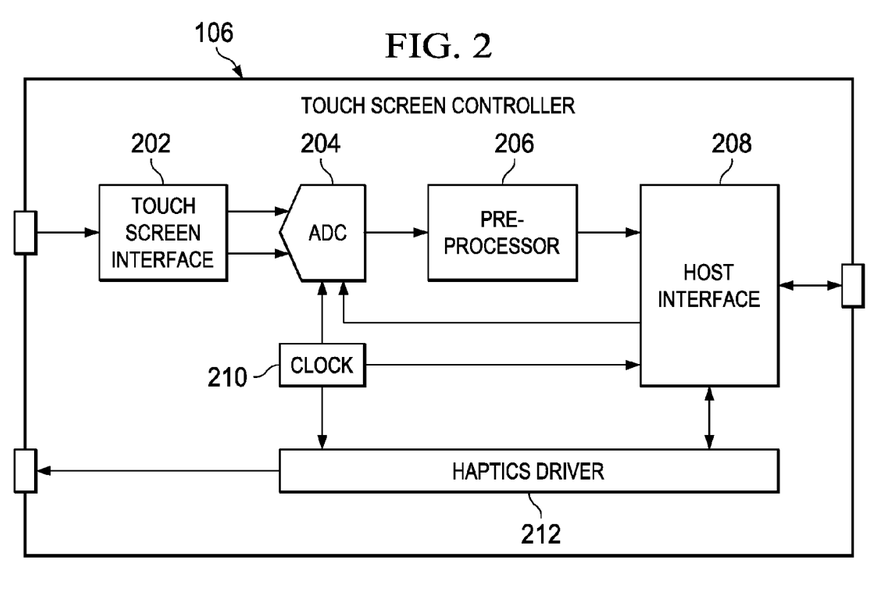
FIG. 2 is a diagram of an example of the touch screen controller of FIG. 1.

In FIG. 2, the touch screen controller 106 (which is typically an integrated circuit or IC) can be seen in greater detail. The touch screen controller 106 generally comprises a touch screen interface 202 (which can, for example, be an interface for a 4-wire resistive touch screen), an analog-to-digital converter (ADC) 204 (which can be a successive approximation register (SAR) ADC), a pre-processor 206, a host interface 208 (i.e., inter-integrated circuit or I²C interface), clock 210, and a haptics driver 212. Generally, the touch screen interface 202 receives data from a touch screen 102 and is converted by ADC 204 to a digital signal (which generally corresponds to a screen location). This digital signal is then processed by the pre-processor 206 and provided to the host processor 104 through the host interface 208. The haptics driver 212 also communicates with the host processor 212 through the interface 208, where it can receive a haptics effect instruction (which can generally correspond to a desired haptic effect). The haptics driver 206 is then able generate a sine wave (that corresponds to the desired haptic effect) for the driver 108 and/or the actuator 110.

The haptics driver 212 (as can be seen in greater detain in FIG. 3 and which can have about 8000 gates) can generate nearly any complex sine wave form using a small instruction set. The haptics driver 212 generally comprises a controller 302, an instruction sequencer 304, a sine wave synthesizer 306 (which generally comprises a sine angle calculator 310, lookup table or LUT 312 and amplitude multiplier 314), and an amplifier 310 (which is generally a class-D amplifier that is comprised of a pulse width modulator or PWM 316 and output circuit 318).

Figure 3:
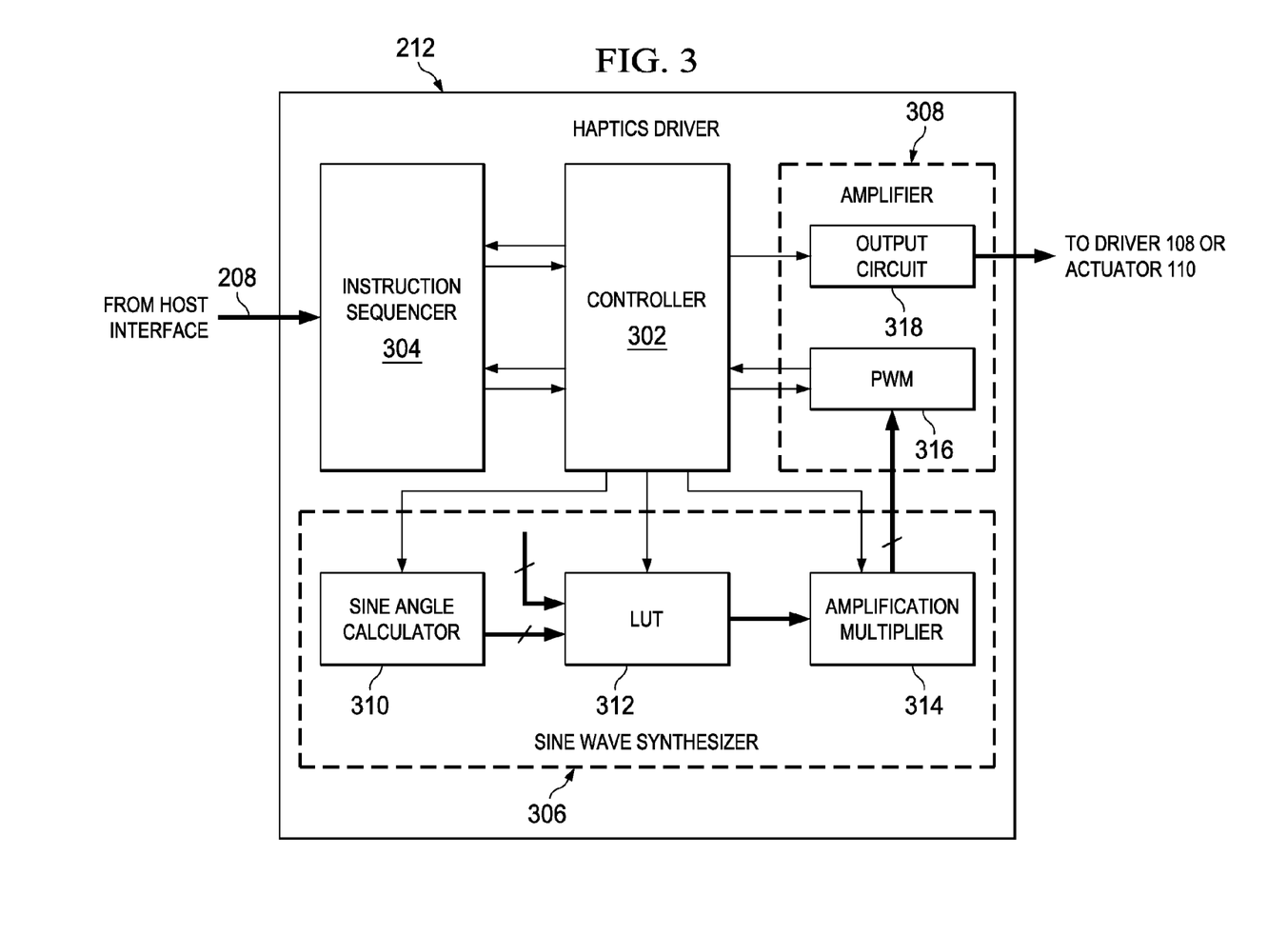
FIG. 3 is a diagram of an example of the haptics driver of FIG. 2.
Figure 4:
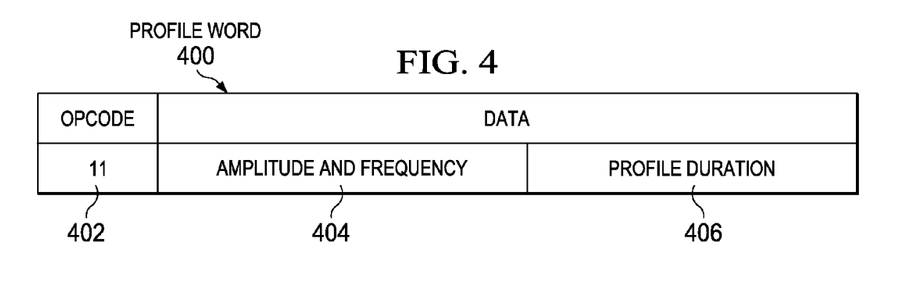
FIGS. 4-7 are diagrams illustrating an example of the instruction set of haptics driver of FIG. 3.
Figure 5:
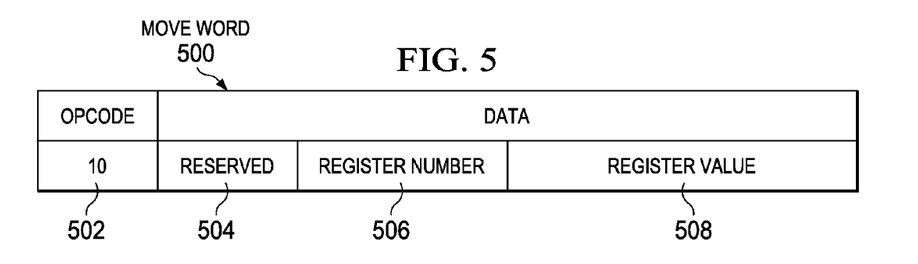
Figure 6:
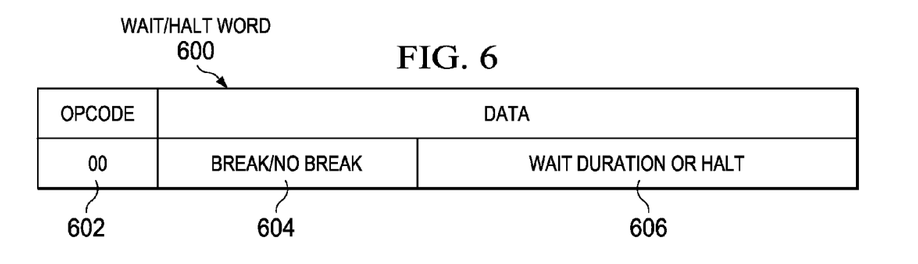
Figure 7:
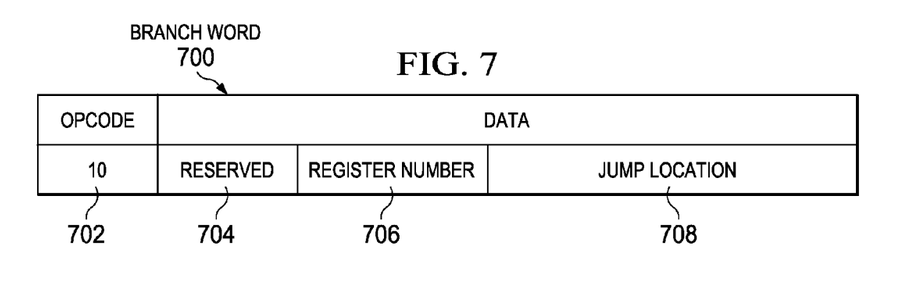

The instruction sequencer 306 is generally a state machine that (in conjunction with the controller 302) decodes the haptics effect instruction from host processor 104 and calls a haptic profile from this decoded haptics effect instruction. Generally, the instruction sequencer 302 stores the instruction set for the haptics driver 212, and this instruction set is generally comprised of four instructions: profile, move, wait/ halt, and branch. These four instructions can be used to generate nearly ever haptics effect and function as the opcode for instruction words (which, in combination, can comprise haptic profile). The profile word 400 (as shown in FIG. 4) is typically an 8-bit word and generally corresponds to sinusoidal portion of an output sine wave from the haptics controller 206. It can include the opcode designation "11" (see reference numeral 402) that corresponds to the profile instruction, and the profile word 400 also can includes as its data an amplitude and frequency field 404 (which is typically a 2-bit field) and profile duration field 406 (which is typically a 4-bit field and generally corresponds to a number of periods). The move word 500 (as shown in FIG. 5) is typically a 16-bit word and generally corresponds to movement across the touch screen 102, where the opcode designation can be "10" (see reference numeral 502) and where the data generally comprises a reserved field 504 (which is typically 1-bit field), a register number field 506 (which is typically a 5-bit field), and register values field 508 (which is typically an 8-bit byte field). The wait/halt word 600 (as shown in FIG. 6) is typically an 8-bit word that can indicate a wait duration or halt execution 604. The opcode designation can be "00" (see reference numeral 602), and the data can include a break/no break field 604 (which is typically a 1-bit field and which can be used for motor deceleration) and a wait duration or halt field 606 (which is typically a 5-bit field). The branch word 700 (as shown in FIG. 7) if typically an 8-bit word and is generally a looping instruction that allows different instructions to be strung together. It can have an opcode designation of "11" (see reference numeral 602) and can include a reserved field 704 (which is typically 1-bit field), a register number field 706 (which is typically a 1-bit field), and a jump location field 708 (which is typically a 4-bit field) as its data.

Based on the haptic profile, the sine wave generator 306 can then generate a sine wave for amplifier 308. Typically, the sine wave generator 306 has two modes of operation: frequency synthesizer mode and fixed pulse width generator (FPWG) mode. In the frequency synthesizer mode, the sine angle calculator 310, LUT 312, and amplitude multiplier 314 collectively calculate the duty cycle for the next pulse for PWM 316. In the FPWG mode, the sine angle calculator 310 and amplitude multiplier 314 are bypassed, allowing the selection of one of (for example) eight fixed pulse width modulated frequencies that produce a sine wave in a frequency range (i.e., between about 10 Hz and about 20 kHz).

Figure 8:
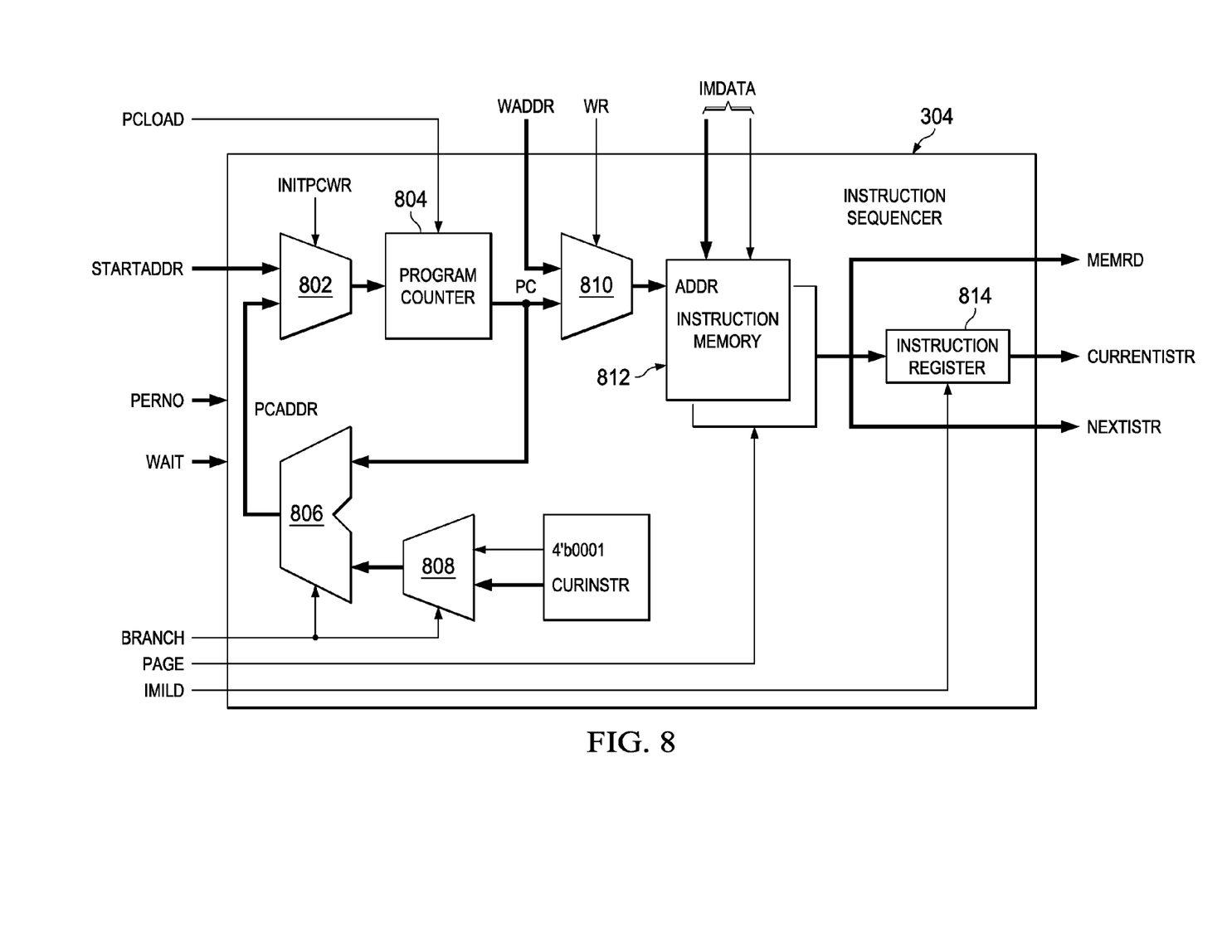
FIG. 8 is a diagram of an example of a portion of the instruction sequencer of FIG. 3.

Turning to FIG. 8, the instruction sequencer 304 can be seen in greater detail, and it is generally comprised of program counter 804, instruction memory 812, instruction register 814, and multiplexer or muxes 802, 806, 808, and 810. Generally, the instruction register 814 (which is generally a bank of registers) holds the parameters and control signals used for haptic operation, and the instruction memory 812 is generally comprised of two pages. Each of the instruction memory 812 and instruction register 814 are also generally implemented using latches. The first page of the instruction memory 812 generally includes built-in haptic profiles (or built-in control word sets), and the second page of the instruction memory 812 can be comprised of user-defined haptic profiles. Each of the control word sets employ the combinations of the words 400, 500, 600, and 700.

Looking first to creation of user-defined haptic profile, these haptic profiles can be stored in the instruction memory 812 (namely, the second page) through the host interface 208. When writing, the write signal WR is asserted through the host interface 208. This allows a user-defined haptics profile to be loaded and stored in the instruction memory 812 (as the data signal IMDATA).

Initially, in normal operation, the controller 302 asserts the program counter write signal INITPCWR and the program counter load signal PCLOAD so that an starting address STARTADDR can be loaded to the program counter 804 through multiplexer 802. The stage address STARTADDR is output (as a program counter signal PC) to multiplexers 806 and 810. With multiplexer 810, an address ADDR is provided to the instruction memory 812. Based on the page selected by the controller 302 through the page signal PAGE, the appropriate word (for the desired haptics profile) is read, and once the controller 302 asserts the load signal IMILD, the instruction register 814 can load the current word CURRENTINSTR (typically eight bits or sixteen bits). Additionally, the program counter signal PC is provided to multiplexer 806 to generate the next address PCADDR. Depending on whether there is a branch word (i.e., 700) used, the controller 302 can select whether a portion of the current instruction CURSTR (typically 4 bits) or a predetermined value can be used. Generally, the current instruction CURRENTINSTR and the next word or instruction NEXTINSTR are used by the controller 302. Additionally, the controller 302 can provide period numbers PERNO and wait signal WAIT to implement wait words (i.e., 600), and the words stored in the instruction memory 812 can be read out through the host interface 208 (as the memory read MEMRD signal).

Figure 9:
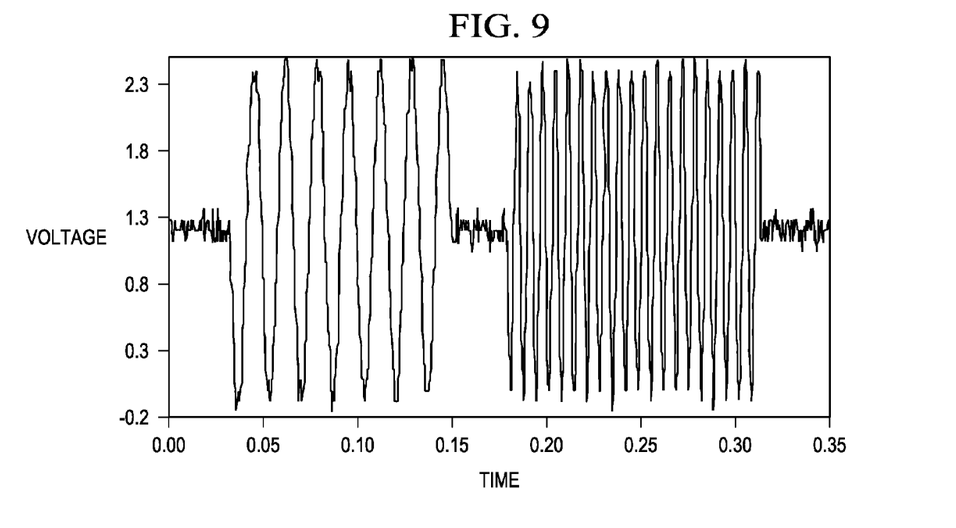
FIGS. 9-11 are diagrams illustrating example sine waves corresponding to different haptics effects generated by the haptics driver of FIG. 3.
Figure 10:
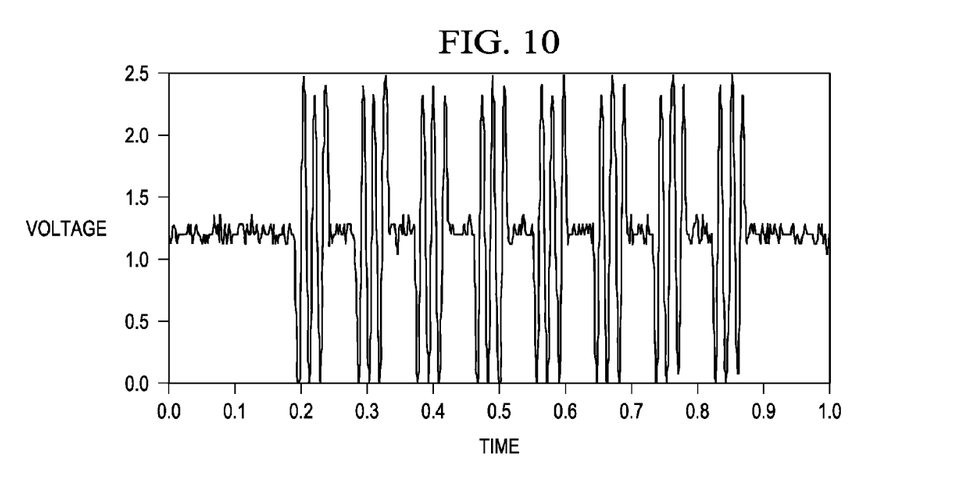
Figure 11:
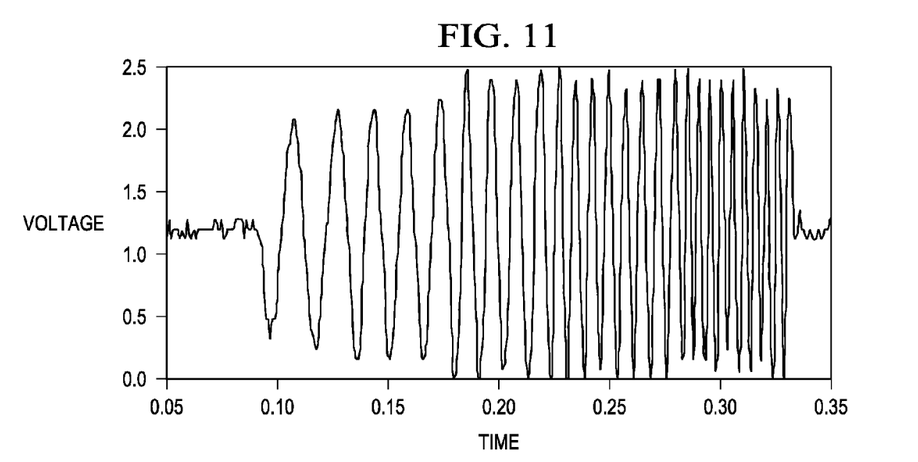

Now turning to FIGS. 9-11, examples of haptics profiles can be seen. The profile in FIG. 9 generally corresponds to a sine wave for a "key touch," and this haptics profile is generally comprised of four words (profile, wait/halt, profile, and wait/halt) shown in Table 1 below.

TABLE 1

| | Word | |
| Order | Opcode | Data |
| --- | --- | --- |
| 1 | 11 | 00 1111 |
| 2 | 00 | 0 00011 |
| 3 | 11 | 01 1111 |
| 4 | 00 | 0 00000 |

The profile in FIG. 10 generally corresponds to "drag-and-drop," and this haptics profile is generally comprised of four words (profile, wait/halt, branch, and wait/halt) shown in Table 2 below.

TABLE 2

| | Word | | |
| Order | Opcode | Data | |
| --- | --- | --- | --- |
| 1 | 11 | 00 | 0001 |
| 2 | 00 | 0 | 00001 |
| 3 | 10 | 0 "Reg0" | 0010 |
| 4 | 00 | 0 | 00000 |

The profile in FIG. 11 generally corresponds to "slide," and this haptics profile is generally comprised of five words (profile, profile, profile, profile, and wait/halt) shown in Table 3 below.

TABLE 2

| | Word | |
| Order | Opcode | Data |
| --- | --- | --- |
| 1 | 11 | 00 1111 |
| 2 | 11 | 01 1111 |
| 3 | 11 | 10 1111 |

TABLE 2-continued

| | Word | | |
|---|---|---|---|
| Order | Opcode | | Data |
| 4 | 11 | 11 | 1111 |
| 5 | 00 | 0 | 00000 |

Each of these difference haptics profiles would be selected based on a user's interaction with a touch screen. Namely, and for example, the host processor 104 would determine that a "drag-and-drop" profile would be appropriate based on an analog data set (which would be converted to a digital data set by ADC 204) of a user performing dragging and dropping an item with the graphical user interface.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a plurality of haptics instructions;
a controller;
an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction; and
a sine wave generator that is coupled to the controller so as to receive the haptic profile and that generates a sine wave from the haptic profile that corresponds to the desired haptics effect,
wherein the plurality of instruction further comprises a profile instruction, a move instruction, a wait/halt instruction, and a branch instruction, and wherein a haptic profile further comprises at least one of a profile word, a move word, a wait/halt word, and a branch word that each include opcode and data, and wherein the profile instruction, the move instruction, the wait/halt instruction, and the branch instruction further comprise the opcode for the profile word, the move word, the wait/halt word, and the branch word, respectively.

2. The apparatus of claim 1, wherein the data for the profile word further comprises amplitude, frequency, and profile duration.

3. The apparatus of claim 2, wherein the data for the move word further comprises a register number and register values.

4. The apparatus of claim 3, wherein the data for the wait/halt word further comprises at least one of a wait duration and halt.

5. The apparatus of claim 3, wherein the data for the branch word further comprises a register number and a jump location.

6. The apparatus of claim 5, wherein the apparatus further comprises an amplifier that is coupled to the sine wave generator.

7. The apparatus of claim 6, wherein the amplifier further comprises a class-D amplifier.

8. An apparatus comprising:
an host interface;
a touch screen interface that is configured to receive data from a touch screen;
an analog-to-digital converter (ADC) that is coupled to the touch screen interface;
processing circuitry that is coupled to the ADC and the host interface;
a haptics driver that is coupled to the host interface, wherein the haptics driver is configured to receive a haptics effect instruction that corresponds to a desired haptics effect, wherein the haptics driver includes:
a plurality of haptics instructions;
a controller;
an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction;
a sine wave generator that is coupled to the controller so as to receive the haptic profile and that generates a sine wave from the haptic profile that corresponds to the desired haptics effect;
an amplifier that is coupled to the sine wave generator,
wherein the plurality of instruction further comprises a profile instruction, a move instruction, a wait/halt instruction, and a branch instruction, and wherein a haptic profile further comprises at least one of a profile word, a move word, a wait/halt word, and a branch word that each include opcode and data, and wherein the profile instruction, the move instruction, the wait/halt instruction, and the branch instruction further comprise the opcode for the profile word, the move word, the wait/halt word, and the branch word, respectively.

9. The apparatus of claim 8, wherein the data for the profile word further comprises amplitude, frequency, and profile duration.

10. The apparatus of claim 9, wherein the data for the move word further comprises a register number and register values.

11. The apparatus of claim 10, wherein the data for the wait/halt word further comprises at least one of a wait duration and halt.

12. The apparatus of claim 11, wherein the data for the branch word further comprises a register number and a jump location.

13. The apparatus of claim 12, wherein the amplifier further comprises a class-D amplifier.

14. The apparatus of claim 12, wherein the instruction sequencer further comprises:
a program counter circuitry that is configured to generate an address sequence corresponding to the haptic profile;
an instruction memory that stores the haptic profile and that is coupled to the program counter circuitry, wherein the instruction memory is configured to receive addresses from the program counter according to the address sequence; and
an instruction register that is coupled to the instruction memory.

15. The apparatus of claim 14, wherein the sine wave generator further comprises:
a sine angle calculator that is coupled to the controller;
a lookup table (LUT) that is coupled to the sine angle calculator and the controller; and
an amplitude multiplier that is coupled to the LUT and controller.

16. An apparatus comprising:
a touch screen;
a host processor that is configured to generate a haptics effect instruction that corresponds to a desired haptics effect;
a controller having:
an host interface that is coupled to the host processor;
a touch screen interface that is coupled to the touch screen;
an ADC that is coupled to the touch screen interface;
processing circuitry that is coupled to the ADC and the host interface;
a haptics driver that is coupled to the host interface, wherein the haptics driver is configured to receive a haptics effect instruction that corresponds to a desired haptics effect, wherein the haptics driver includes:
a plurality of haptics instructions;
a controller;
an instruction sequencer that is coupled to the controller and that is configured to receive a haptics effect instruction, wherein the haptics effect instruction corresponds to a desired haptics effect, and wherein instruction sequencer and controller call a haptic profile using the plurality of haptics instructions that corresponds to the haptic effect instruction;
a sine wave generator that is coupled to the controller so as to receive the haptic profile and that generates a sine wave from the haptic profile that corresponds to the desired haptics effect; and
an amplifier that is coupled to the sine wave generator that generates a sine wave that corresponds to the desired haptics effect; and
an actuator that is coupled to the amplifier,
wherein the plurality of instruction further comprises a profile instruction, a move instruction, a wait/halt instruction, and a branch instruction, and wherein a haptic profile further comprises at least one of:
a profile word having the profile instruction as its opcode and having amplitude, frequency, and profile duration as its data;
a move word having the move instruction as its opcode, and having a register location and register values as its data;
a wait/halt word having the wait/halt instruction as its opcode and having at least one of a wait duration and halt as its data; and
a branch word having the branch instruction as its opcode and having a register number and jump location as its data.

17. The apparatus of claim 16, wherein the amplifier further comprises a class-D amplifier.

18. The apparatus of claim 17, wherein the instruction sequencer further comprises:
a program counter circuitry that is configured to generate an address sequence corresponding to the haptic profile;
an instruction memory that stores the haptic profile and that is coupled to the program counter circuitry, wherein the instruction memory is configured to receive addresses from the program counter according to the address sequence; and
an instruction register that is coupled to the instruction memory.

19. The apparatus of claim 18, wherein the sine wave generator further comprises:
a sine angle calculator that is coupled to the controller;
a lookup table (LUT) that is coupled to the sine angle calculator and the controller; and
an amplitude multiplier that is coupled to the LUT and controller.

20. A method for generating a desired haptics effect, the method comprising:
generating a plurality of haptics effect instructions by a host processor responsive to a touch screen, wherein the haptics effect instruction corresponds to the desired haptics effect;
wherein the haptics effect instructions further comprise:
a profile instruction;
a move instruction,
a wait/halt instruction and a branch instruction,
receiving at least one of the haptics effect instructions by a haptics driver;
generating a haptic profile from the haptics effect instruction, wherein the haptic profile includes at least one of:
a profile word,
a move word,
a wait/halt word, and a branch word
wherein each profile word, move word, wait/hold word, and branch word include opcode and data, and wherein the profile instruction, the move instruction, the wait/halt instruction, and the branch instruction further comprise the opcode for the profile word the move word, the wait/halt word and the branch word respectively; and
generating a sine wave from the from the haptic profile that corresponds to the desired haptics effect.

21. The apparatus of claim 20, wherein the step of generating the haptic profile further comprises:
decoding the haptics effect instruction; and
calling the haptics profile from instruction memory.

22. The apparatus of claim 21, wherein the step of generating the haptics effect instruction further comprises:
receiving an analog data set from the touch screen;
converting the analog data set to a digital data set; and
determining the haptics effect instruction from the digital data set.

* * * * *